United States Patent [19]

Suzuki

[11] Patent Number: 5,717,653
[45] Date of Patent: Feb. 10, 1998

[54] LATE-WRITE TYPE SRAM IN WHICH ADDRESS-DECODING TIME FOR READING DATA DIFFERS FROM ADDRESS-DECODING TIME FOR WRITING DATA

[75] Inventor: Azuma Suzuki, Tokyo, Japan

[73] Assignee: Kabushiki Kaisha Toshiba, Kawasaki, Japan

[21] Appl. No.: 708,042

[22] Filed: Aug. 30, 1996

[30] Foreign Application Priority Data

Aug. 31, 1995 [JP] Japan .................. 7-224240
Aug. 16, 1996 [JP] Japan .................. 8-216428

[51] Int. Cl.$^6$ .................................................. G11C 8/00
[52] U.S. Cl. .................. 365/233; 365/194; 365/189.07; 365/230.06
[58] Field of Search ................. 365/230.06, 233, 365/194, 189.04, 189.07

[56] References Cited

U.S. PATENT DOCUMENTS 5,402,389  3/1995  Flannagan et al. ................ 365/233

Primary Examiner—Joseph A. Popek
Attorney, Agent, or Firm—Banner & Witcoff, Ltd.

[57] ABSTRACT

A static random-access memory (SRAM) of late-write type, in which the total time required to write data is reduced, thereby increasing the write margin. No time is therefore wasted in writing and reading data. The SRAM has an address register for holding a write address, besides an address register for holding an input address. A pass gate selects the write address held in the address register or the input address held in the address register. In a read cycle, a decoding path is formed to decode a read address, without using delay circuits. In a write cycle, a second decoding path is formed to decode a write address, using delay circuits. In the cycle preceding the first write cycle coming after the operating mode of the SRAM is switched from the read mode to the write mode, a third decoding path is formed to decode the write-address signal read from the address register. The first, second and third decoding paths are controlled by pass gates.

18 Claims, 9 Drawing Sheets

FIG. 5

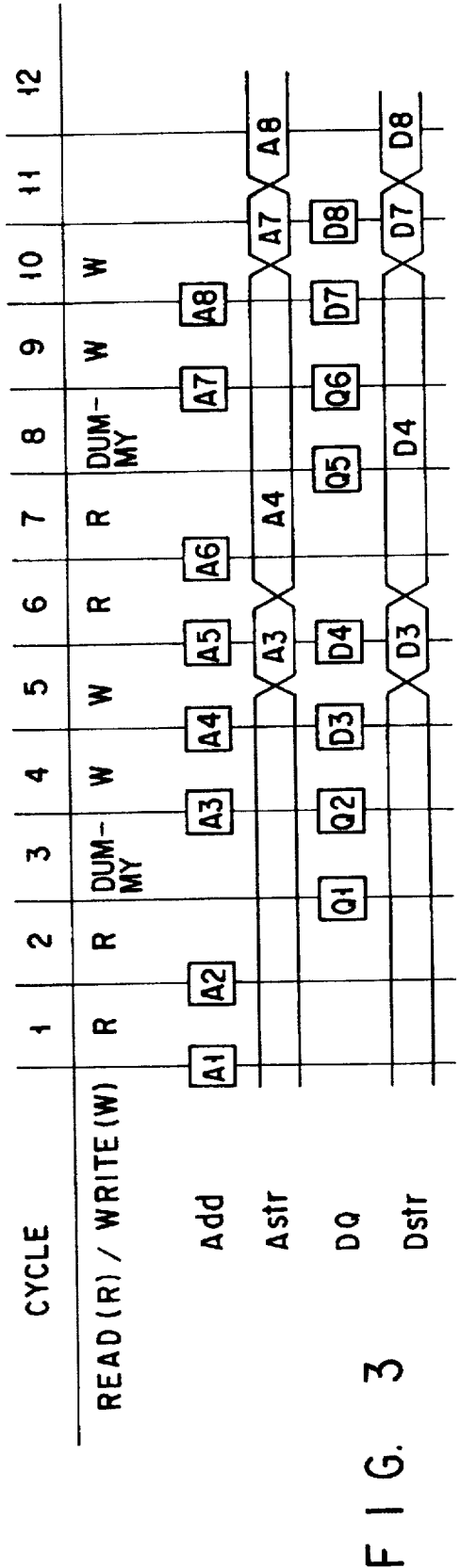
F I G. 3

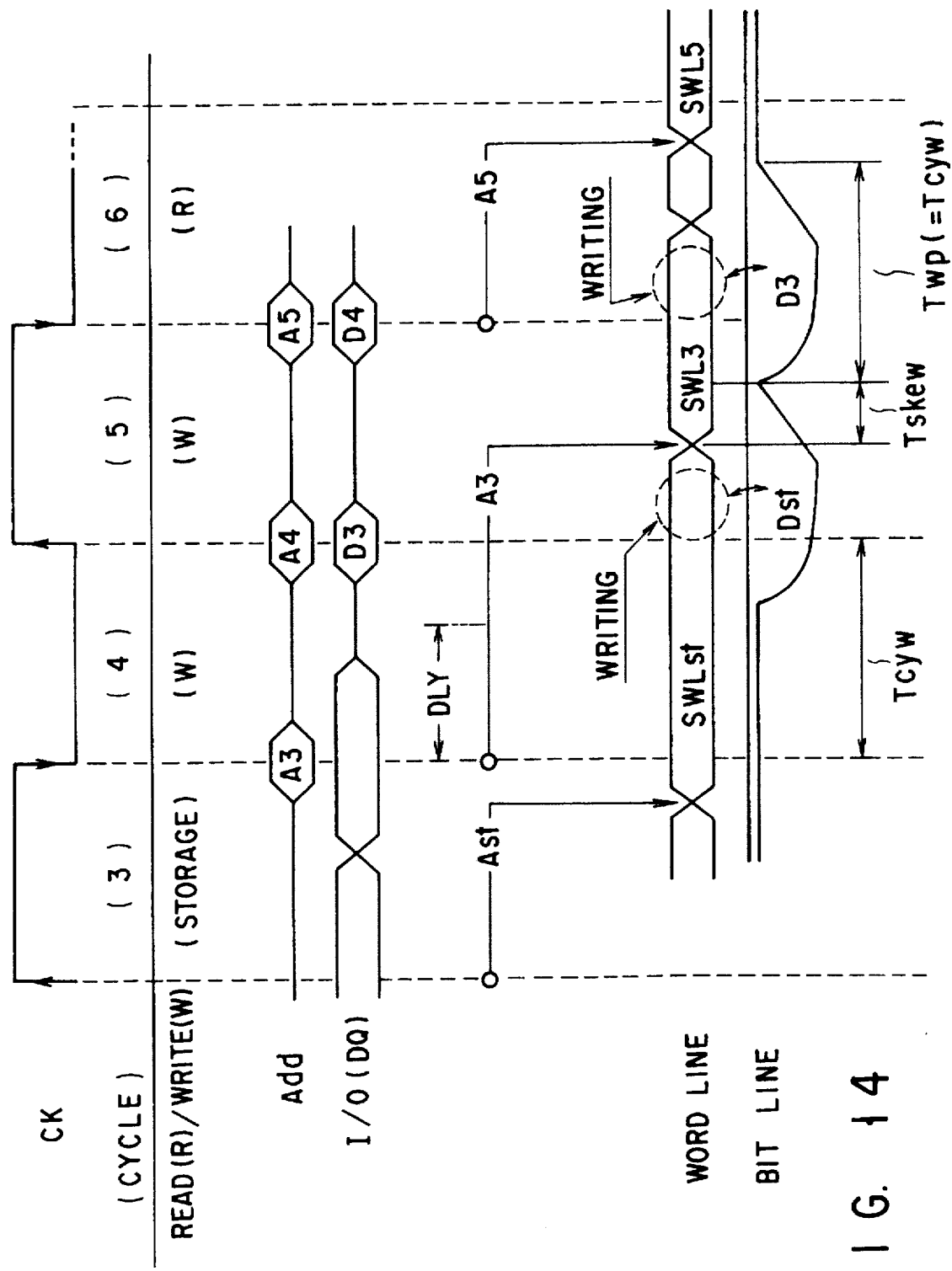
F I G. 14

LATE-WRITE TYPE SRAM IN WHICH ADDRESS-DECODING TIME FOR READING DATA DIFFERS FROM ADDRESS-DECODING TIME FOR WRITING DATA

BACKGROUND OF THE INVENTION

1. Field of the Invention

The present invention relates to a SRAM (Static Random-Access Memory) and, more particularly to an address-decoding peripheral circuit which performs data-accessing in synchronism with a clock signal, so as to write data is written in the write cycle next to a cycle in which the write address signal is designated.

2. Description of the Related Art

FIG. 1 is a block diagram of a conventional synchronous SRAM. As shown in FIG. 1, the SRAM comprises a decoder 100 incorporating an address register 101. The address register 101 is controlled by a signal CK*W which is a logic product of a write signal *W internally generated and a clock signal CK generated from an externally supplied clock signal. Thus controlled, the address register 101 stores an address signal Add supplied externally.

The SRAM further comprises registers 102, 103, 104 and 105 and an output buffer 109. The registers 102 and 103 provided for storing a chip-selecting signal /S and a write enable signal /W, respectively. The outputs the signals /S and /W under the control of the clock signal CK. The register 105 transfers data DQ from an I/O interface or thereto, in synchronism with the clock signal CK. The output buffer 109 is controlled by a signal /G to transfer data so as to prevent collision of data items. The register 104 provided for storing input data is controlled by the signal CK*W.

The SRAM further comprises a control circuit 106. The circuit 106 is designed to generate signals SWE, SAE and WP in accordance with the internal write signal *W, a read-mode signal and a write-mode signal. The signal SWE controls the load circuit for the bit lines. The signal SAE control the sense amplifier. The signal WP controls the write transistors. The internal write signal *W is a logic product of the chip-selecting signal /S and the write enable signal /W. The address register 101 has capacity of storing only one address signal. It is the address signal stored in the register 101 that designates a memory cell to be selected.

FIG. 2 is a timing chart showing the read (R) and write (W) cycles of the conventional SRAM. As can be understood from FIG. 2, the data designated by an address signal A1 in cycle 1 is read out in cycle 2. Output data Q1 (i.e., data DQ) is obtained at the leading edge of, for example, the clock pulse for cycle 3. It is in cycle 5 that data D3 is written, in its entirely, into the memory cell designated by an address signal A3.

Generally, the more memory cells a memory device has, the more input/output pads the memory needs. To reduce the number of input/output pads required, the conventional SRAM adopts I/O common system, as do most memory devices. In the I/O common system, dummy cycles 3, 4, 9, 10, . . . , in which no addresses are designated. In the dummy cycle 4, no address is designed to prevent collision of output data Q2 and input data D3. In the dummy cycle 3, no address is designed so that the data corresponding to the address signal A2 designated in the read cycle 2 may be read out in this cycle. The dummy cycles 9 and 10 are necessarily interposed between the read cycle 8 and the write cycle 11. The write cycle 12 is provided for writing data d8 into the memory cell corresponding to the address signal A8.

In the I/O common system, one dummy cycle is required for each transition from a read cycle to a write cycle in order to prevent collision of the output data and the input data. Because of the dummy cycles thus required lengthen the overall read-write time. This prevents an increase in the operating speed of the conventional SRAM.

SUMMARY OF THE INVENTION

Accordingly it is the object of this invention to provide a synchronous static random-access memory in which no time is wasted in writing and reading data and which can therefore operate at high speed.

To attain the object, a type static random-access memory (SRAM) of late-write type according to the present invention is characterized in that the memory-cell array is accessed in synchronism with a clock signal and that data is read in a read cycle for designating a read-address signal and written in a write cycle next to a cycle for designating a write-address signal, data is read in a read cycle for designating a read-address signal and written in a write cycle next to a cycle for designating a write-address signal, a timing of decoding the read-address signal in the read cycle is different from a timing of decoding the write-address signal in a cycle preceding the write cycle, thereby accessing the memory-cell array at a time in a read mode and at a different time in a write mode. In the present invention, the total time required to write data by late-write method is thereby reduced, increasing the write margin.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a timing chart explaining the operation of a late-write type, synchronous SRAM;

FIG. 14 is a timing chart explaining how a word line is activated to access an address and how data is transferred to a bit line, in another mode.

DETAILED DESCRIPTION OF THE PREFERRED EMBODIMENTS

A synchronous SRAM according to the present invention perform late-write type address decoding. Data is written into the SRAM by the method called "late-write." In this method, a write-address signal is designated in the cycle immediately preceding the cycle of inputting the data corresponding to the write address.

Figure 1:
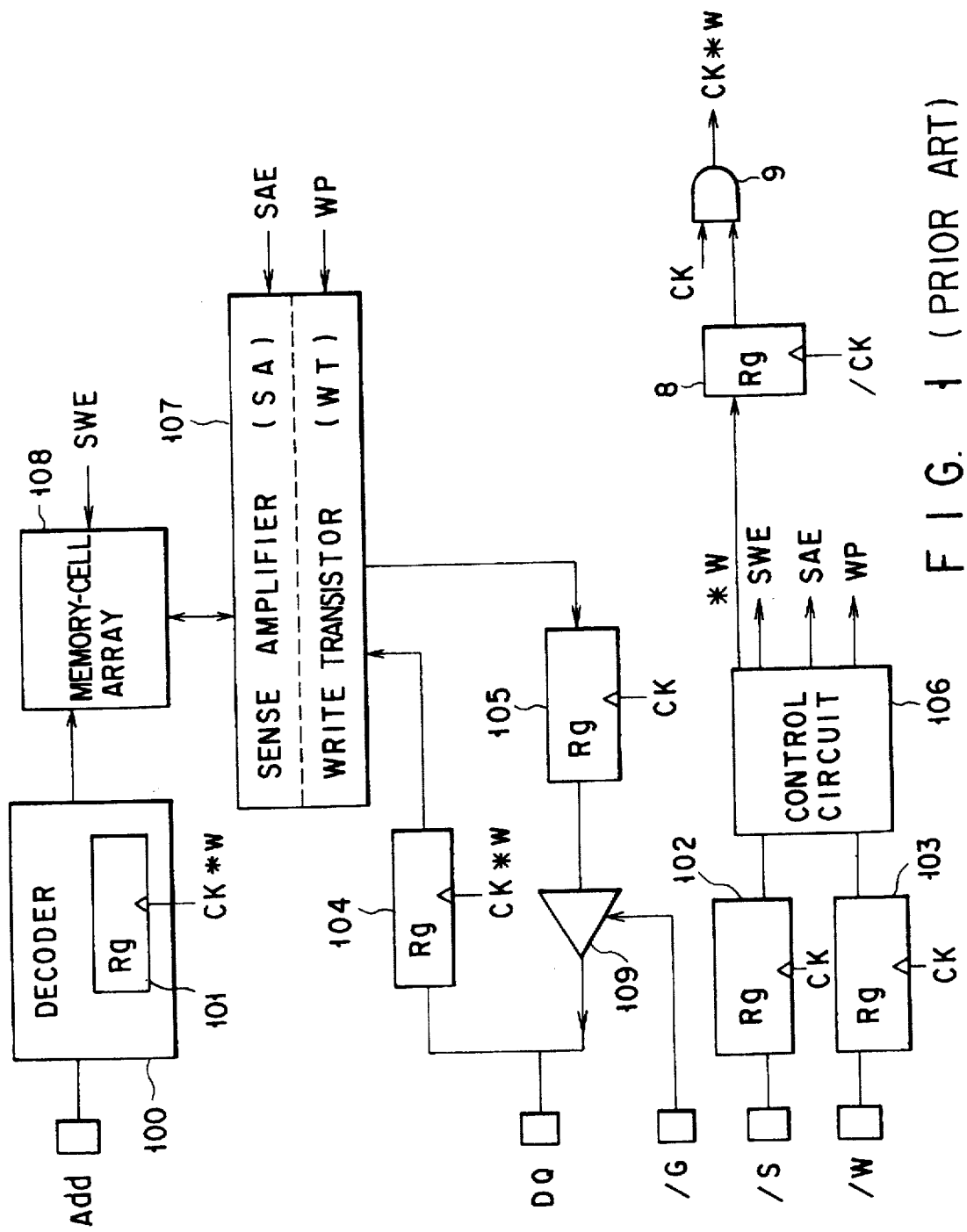
FIG. 1 is a block diagram of a conventional synchronous SRAM.
Figure 2:
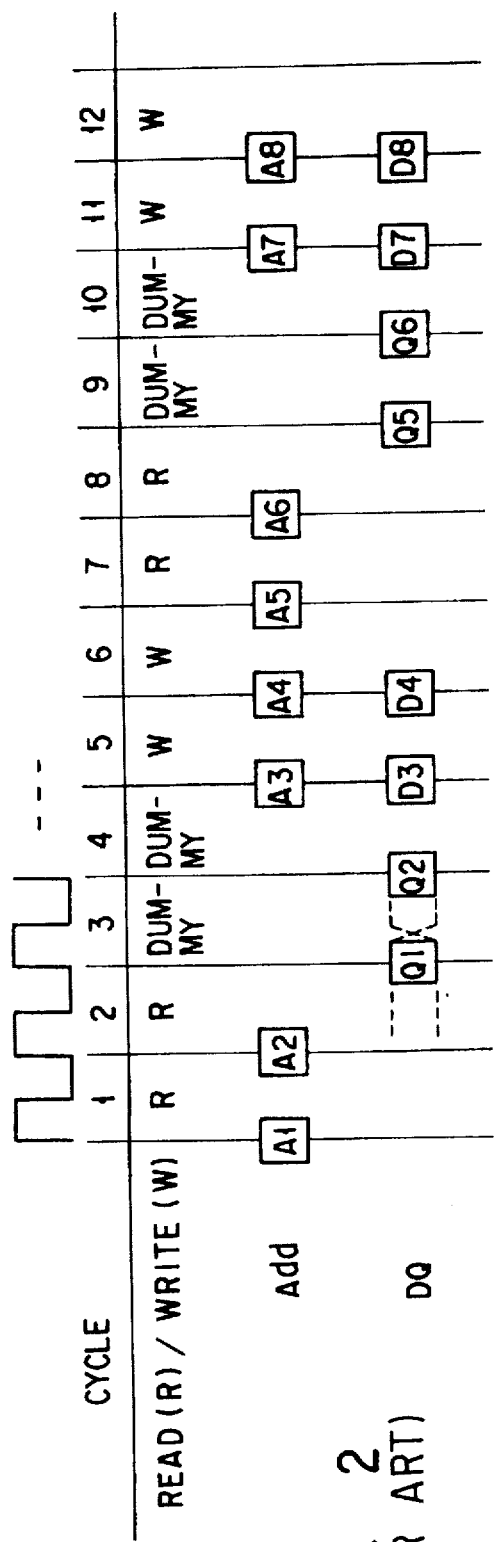
FIG. 2 is a timing chart showing the read and write cycles of the conventional SRAM.

FIG. 3 is a timing chart illustrating the late-write method. As seen from FIG. 3 in comparison with FIG. 2, data Q2 is read and data D3 are written at the same timing as in the conventional SRAM (FIG. 1). The write-address signal A3 corresponding to data D3 is input in the write cycle 4, and the data D3 does not collide with any other data. Thus, a dummy cycle need not be interposed between the cycles 3 and 5. The late-write method consists of 11 cycles, whereas the conventional write method consists of 12 cycles. In other words, the late-write method completes one cycle faster than the conventional write method illustrated in FIG. 2. "Astr" and "Dstr," both shown in FIG. 3, will be described later.

Figure 4:
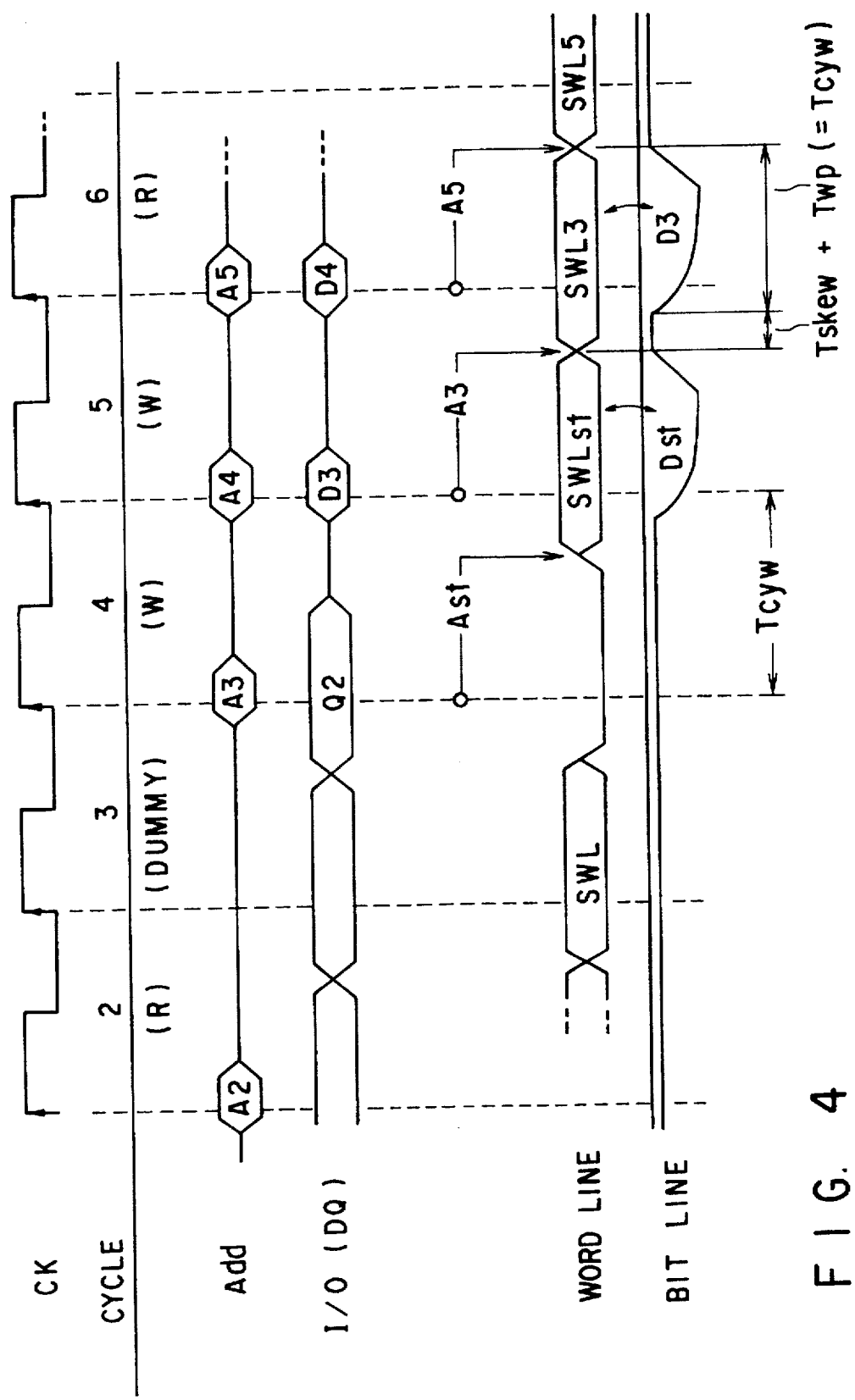
FIG. 4 is a timing chart explaining the operation of a late-write type, synchronous SRAM which is defective.

FIG. 4 is a timing chart, explaining how a word line is activated to access an address and how data is transferred to a bit line in late-write method. Shown in FIG. 4 are the cycles 2, 3, 4, 5 and 6 of the timing chart of FIG. 3.

In the late-write method, data is input and written into a memory cell in the cycle immediately following the cycle in which the write-address signal which corresponds to the data is designated. The data D3, for example, is written in the cycle 5 into the memory cell corresponding to the write-address signal A3.

In the last of a series of write cycles, no data can be written into a memory cell. The data is written in the next write cycle, that is, the first write cycle which follows the next read cycle. For example, the data Dstr input in the write cycle preceding the read cycle 2 and corresponding to the last write-address signal Astr supplied before the read cycle 2 is written in the write cycle 4. In the write cycle 5, the bit-line potential is set for the data D3 which is to be written into the memory cell corresponding to the write-address signal A3, and the data D3 is therefore written into this memory cell. The write-address signal A3 designated in the write cycle 4 corresponds to the data which should be written in the last write cycle preceding a read cycle. Hence, the write-address signal A3 and the data D4 corresponding to the write-address signal A3 are held in registers (not shown) until the next write cycle, as a write-address signal Astr and data Dstr, respectively, as can be seen from FIG. 3.

In order to prevent erroneous writing of data, the word line must be selected before the data is supplied through the bit line. The word line SWL3, for example, needs to be selected before the data D3 is decoded. However, some time is required to decode an address signal so as to select the word line. The data D3 can therefore be supplied to the bit line of the memory-cell array before the word line SWL3 is selected. It is necessary to delay the supply of the data D3 to the bit line until the word line SWL3 is selected. To delay the supply of the data D3, a write-timing margin Tskew is provided as illustrated in FIG. 4. Further, the reading of data immediately after any write cycle must not be delayed. To prevent such a delay, the bit line needs to recover the potential it had at the time of writing data, well before the word line SWL5 is selected in the read cycle.

As can be understood from FIG. 4, the minimum write-cycle time Tcyw cannot be shorter than the value of (Tskew+Twp) because the write-timing margin Tskew is indispensable for delaying the supply of the data D3 to the bit line until the word line SWL3 is selected. "Twp" is the width of a writing pulse, defining the analog operating time required to select and activate a bit line (i.e., to recover the bit line potential) through which to supply data to a memory cell. In a known SRAM, Tskew=0.6 ns, Twp=2.4 ns, and Tcyw=3.0 ns.

The present invention is based on the fact that the cycle time is lengthened because of the write-timing margin Tskew in the late-write method. Using the late-write method, the invention provides a synchronous SRAM in which the write-timing margin Tskew is compensated for, thus reducing the overall read-write time, and the bit line can fast recover its initial potential, successfully preventing a delay of the reading of data immediately after any write cycle.

Figure 5:
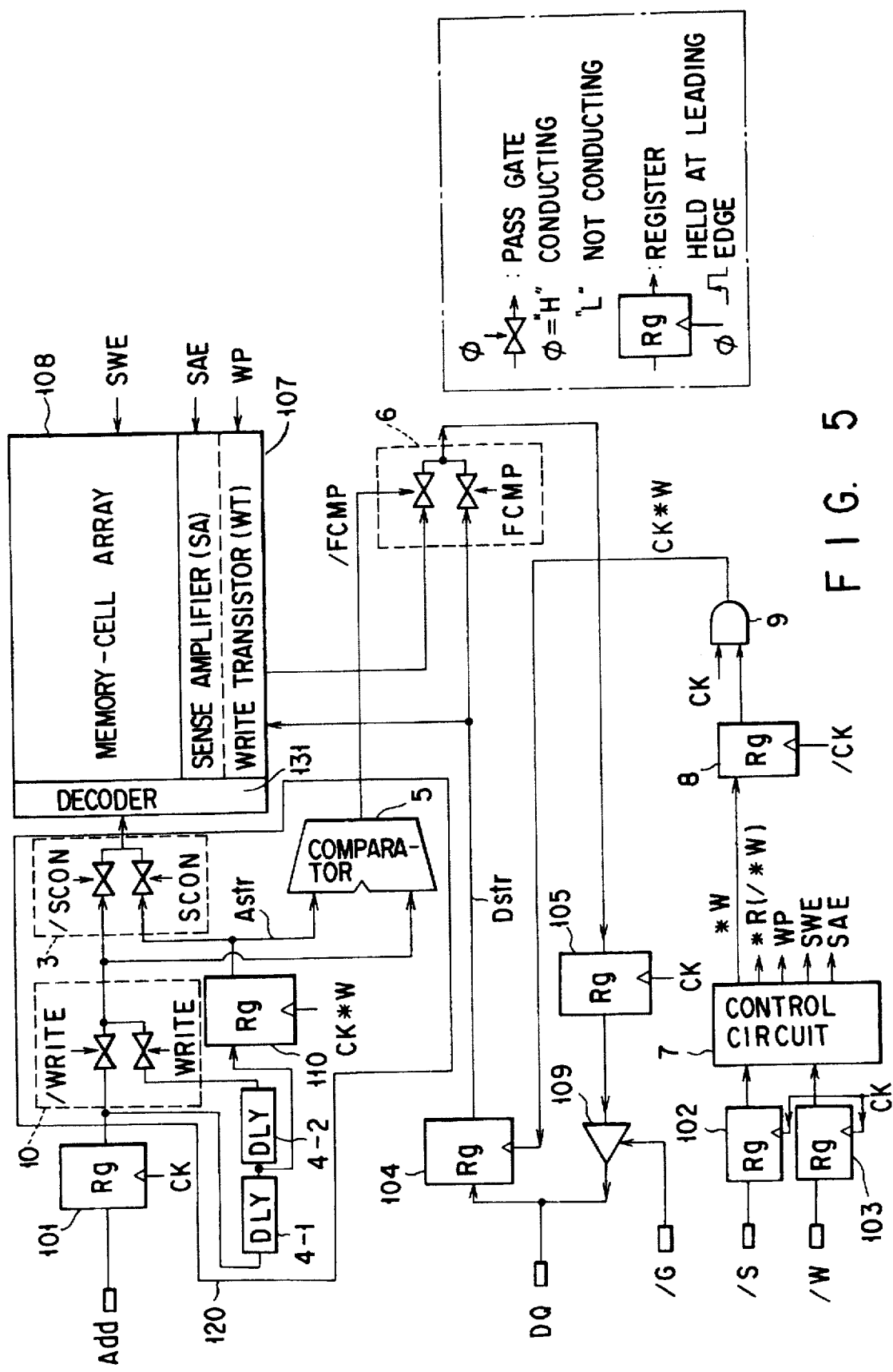
FIG. 5 is a block diagram of a late-write type, synchronous SRAM according to an embodiment of the present invention.

FIG. 5 is a block diagram of a late-write type, synchronous SRAM according to the present invention. As shown in FIG. 5, an address signal register 110 for holding a write-address signal is provided, separated from the address signal register 101 of the same type shown in FIG. 1. A pass gate 3 is provided to select either the address signal held in the register 101 or the address signal held in the register 110.

In all write cycles, except the first write cycle, the address signal Add is transferred from the register 110 to a decoder 131 when the pass gate 3 is activated by a signal /SCON. The decoder 131 decodes the address signal Add, selecting one of the memory cells of a memory-cell array 108. The first writing of data is achieved by selecting one of the memory cells of the array 108 in accordance with the address signal Add when the pass gate 3 is activated by a signal SCON.

In the late-write method, no data is written in the last of a series of write cycles. Nor is it written in the immediately next read cycle. The write-address signal and the data input in the last write cycle are held in the register 110 and the register 104, respectively. In the immediately next write cycle, the write-address signal will be supplied to the decoder 131 via the pass gate 3, and the input data will be written into a memory cell.

A pass gate 10 is provided to allow the passage of either a read-address signal input in a read cycle or a write-address signal input in any write cycle following the read cycle, except the write cycle immediately following the read cycle. More precisely, the pass gate 10 allows the passage of a read-address signal when activated by a signal /WRITE, and allows the passage of a write-address signal when activated by a signal WRITE. The write-address signal passing through the pass gate 10 has been supplied through a delay circuit 4-1 and a delay circuit 4-2 and is, therefore, delayed by the total delay time of the circuits 4-1 and 4-2. The delay circuit 4-1 is connected to the input of the register 110, adjusting the input timing of the register 110.

The register 110 is controlled by a signal CK*W which is a logic product of an internal write signal *W and an internal clock signal CK. The register 104 is controlled by the signal CK*W, too. The write signal *W is a logic product of a chip-selecting signal /S and a write enable signal /W, both supplied externally. The signal *W is generated by a control circuit 7. The register 104 is controlled by the signal CK*W.

The address signals output from the registers 101 and 110 are supplied to a comparator 5. A pass gate 6 allows the passage of the data held in the register 104 when the address signals of the comparator 5 coincide with each other and the pass gate 6 activated by a signal FCMP. This works well in the case where the data to be written in the last write cycle, held in the register 104, corresponds with a read-address in the next read cycles. In other words, the data is read from the register 104 much earlier than it is actually written into a memory cell. The data Dstr read from the register 104 is held in a register 105 when a clock signal CK is supplied to the register 105. The data Dstr is supplied as I/O data DQ via an output buffer 109 when a signal /G is supplied to the buffer 109.

Normal data-reading operation is carried out as will described below.

When the pass gate 6 is activated by a signal /FCOM, it selects one of the memory cells included in the array 108, in accordance with the address signal held in the register 101. Data is read from the memory cell thus selected and supplied to the sense amplifier provided in a unit 107. This data is held in the register 105 when the clock signal CK is supplied to the register 105. The data is the supplied as I/O data DQ via the output buffer 109 when a signal /G is supplied to the buffer 109.

A register 8 and an AND gate 9 are provided, consituting a control signal generator, which generates a signal for controlling the register 104 to achieve late-write operation. The register 8 receives the signal *W from the control circuit 7. The signal *W is set at high level H when both the chip-selecting signal /S and the write enable signal /W are input to the control circuit 7 from registers 102 and 103, respectively. The register 8 outputs the signal *W of high level H at the trailing edge of the clock signal CK. The AND gate 9 outputs the signal *W of high level H at the leading edge of the clock signal CK. Upon receipt of the signal *W at high level H, supplied from the gate 9, the register 104 outputs the I/O data DQ to the pass gate 6.

The control circuit 7 receives not only the signals /S and /W but also signals *R, SWE, SAE and WP. The signal *R is an internal read signal obtained by inverting the internal write signal *W. The signal SWE controls the load circuit for the bit lines in accordance with the data-writing mode or the data-reading mode. The signals SAE controls the sense amplifier provided in the unit 107, and the signal WP controls the write transistors provided also in the unit 107.

Figure 6:
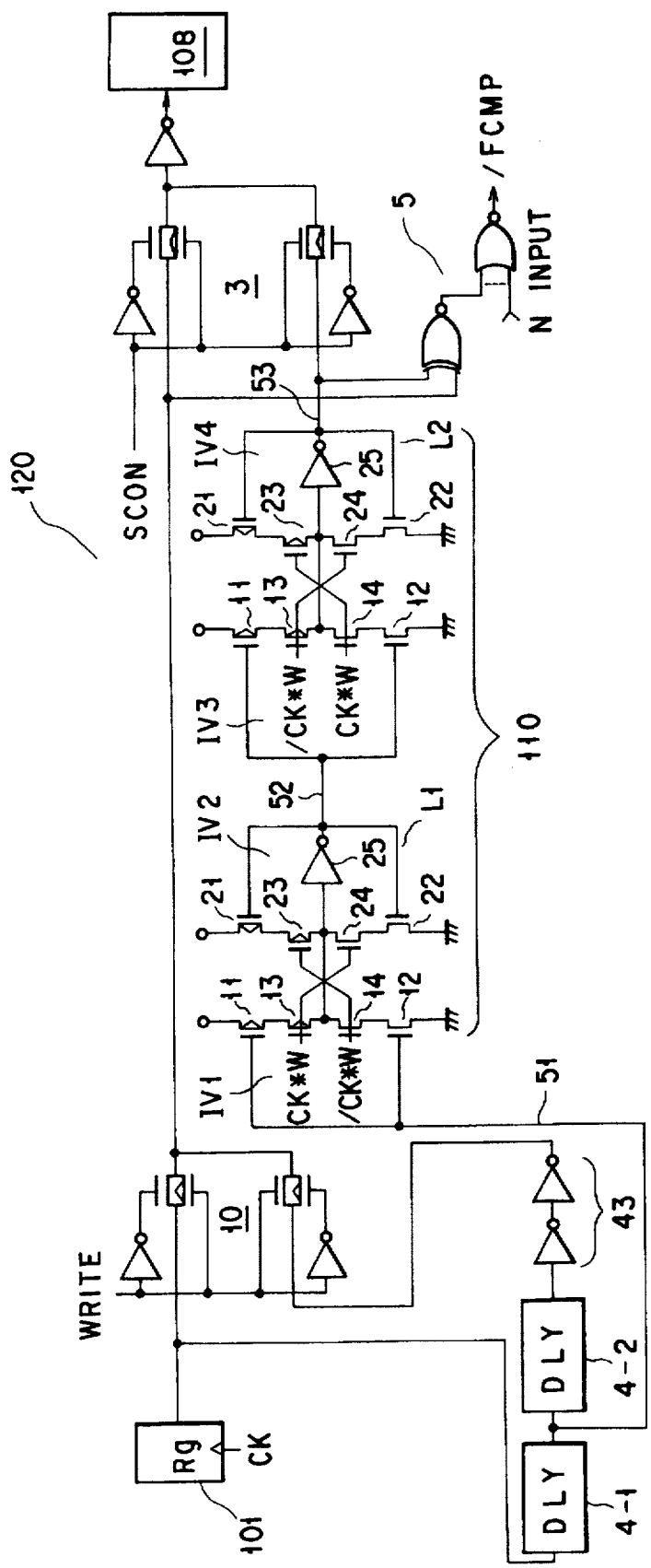
FIG. 6 is a circuit diagram of the late-write decoding control circuit incorporated in the SRAM shown in FIG. 5.

The pass gate 3, delay circuits 4-1 and 4-2, comparator 5, pass gate 10 and register 110 constitute a late-write decoding control circuit 120 (FIG. 6). As shown in FIG. 6, the pass gates 3 and 10 are similar in structure. They are each a transfer control gate comprising a P-channel MOS transistor and an N-channel MOS transistor whose source-drain paths are connected in parallel. The signals SCON and /SCON supplied to the pass gate 3 and the signals WRITE and /WRITE supplied to the pass gate 10 are generated by generators, which will be described later.

The delay circuit 4-1 is used, mainly to adjust the latch timing of the register 110. The delay circuit 4-2 is provided for set a desired difference between the time required for decoding an address signal to select a word line and the time for maintaining the word line selected. The delay circuits 4-1 and 4-2 may each have a various structure. For example, each may comprise inverters connected in series and having their threshold values controlled. A series circuit 43 of two inverters is connected to the delay circuit 4-2, functioning as a drive buffer. As indicated above, the write-address signal passing through the pass gate 10 is delayed by the total delay time of the circuits 4-1 and 4-2, with respect to the read-address signal passing through the pass gate 10.

The register 110 receives the address signal supplied through the delay circuit 4-1, i.e., the signal at a node 51. As shown in FIG. 6, the register 110 comprises two latches L1 and L2 which are connected in series.

The first latch L1 comprises two clocked inverter circuits IV1 and IV2. The inverter circuit IV1 has a P-channel MOS transistor 11, an N-channel MOS transistor 12, a P-channel MOS transistor 13 and an N-channel MOS transistor 14. The common gate of the MOS transistors 11 and 12 receives the signal at the node 51. The gate of the MOS transistor 13 receives the signal CK*W, and the gate of the MOS transistor 14 receives a signal /CK*W obtained by inverting the signal CK*W. The signals CK*W and /CK*W control the output of the clocked inverter IV1. The inverter IN2 has a P-channel MOS transistor 21, an N-channel MOS transistor 22, a P-channel MOS transistor 23, an N-channel MOS transistor 24 and an inverter 25. The output the inverter IV1 generates when activated is supplied to the inverter 25, which inverts the output of the inverter IV1. The output of the inverter IV1, thus inverted, is supplied to a node 42 as the output of the clocked inverter IN2. It is also supplied to the common gate of the P-channel MOS transistor 21 and the N-channel MOS transistor 22. The gate of the P-channel MOS transistor 23 receives the signal /CK*W, and the gate of the N-channel MOS transistor 24 receives a signal CK*W. The signals CK*W and /CK*W control the output of the clocked inverter IV2.

The second latch L2 is identical in structure to the first latch L1. It differs only in the control signals used. More specifically, the signal at the node 52 is supplied to the common gate of the P-channel MOS transistor 11 and N-channel MOS transistor 12 of the inverter IN3, and the gates of the P-channel MOS transistor 13 and N-channel MOS transistor 14 of the inverter IN3 receive the signals /CK*W and CK*W, which control the output of the clocked inverter IV3. The output the inverter IV3 generates when activated is supplied to the inverter 25, which inverts the output of the inverter IV3. The output of the inverter IV3, which is in the same phase as the signal at the node 52, is supplied to a node 53 as the output of the Inverter IN4. The output of the inverter IV3 is also supplied to the common gate of the P-channel MOS transistor 21 and N-channel MOS transistor 22 of the inverter IN4. The gates of the P-channel MOS transistor 23 and N-channel MOS transistor 24 of the inverter IV4 receive the signal CK*W and the signal /CK*W, respectively. The signals CK*W and /CK*W control the output of the clocked inverter IV4.

How the register 110 operates will be explained. When the signal CK*W falls to low level, the inverter IV1 of the first latch L1 is activated, whereby the signal at the node 51 is supplied to the input node 52 of the second latch L2. At this time, the inverter IV4 is active, and the signal for the preceding cycle is supplied from the node 52 to the node 53 through the inverter 25. When the signal CK*W rises to high level, the inverter IV1 of the first latch L1 is deactivated, and the signal at the node 51 is no longer supplied to the input node 52 of the second latch L2. On the other hand, the inverter IN2 is activated, whereby the signal at the node 51 for the preceding cycle is held at the node 52. The inverter IV3 of the second latch L2 is also activated, whereby the signal at the node 52 is supplied to the node 53 through the inverter 25.

Figure 7:
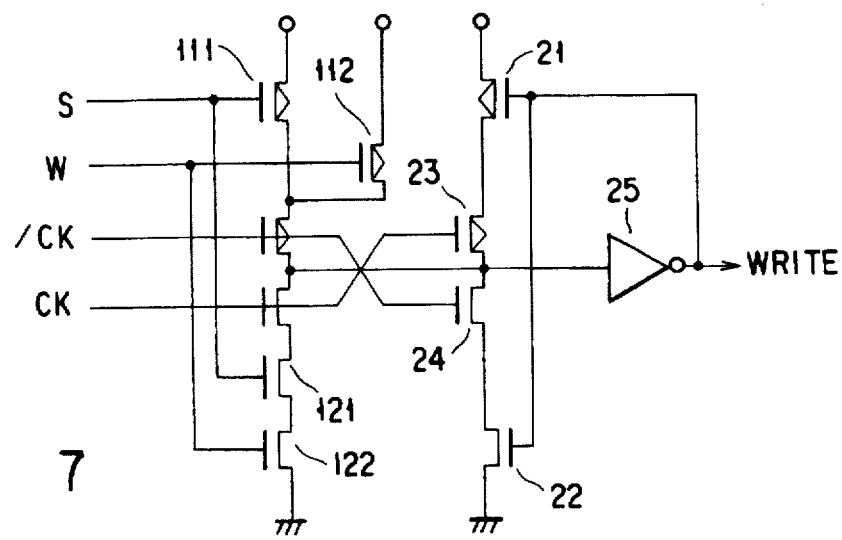
FIG. 7 is a circuit diagram of a signal-generating circuit designed to generate a signal WRITE for controlling the pass gate shown in FIG. 6.

FIG. 7 is a circuit diagram showing a signal-generating circuit which generates the signal WRITE for controlling the pass gate 10 shown in FIG. 6. This circuit is similar to, for example, the second latch L2 shown in FIG. 6, but different in that a multi-input clocked NAND gate is used in place of the clocked inverter IV3. The circuit is activated and deactivated by the clock signal /CK and CK. The logic output of the NAND gate, generated from the signals S and W obtained by inverting the chip-selecting signal /S and the write enable signal /W, is used as the signal WRITE.

In the circuit of FIG. 7, when the clock signal CK rises to high level, the NAND gate is activated, and the signal WRITE generated from the signals S and W is output. When the clock signal CK falls to low level, the signals S and W for the present cycle are not processed at all, and the signal the NAND gate has generated from the signals S and W for the preceding cycle is held as the signal WRITE.

Figure 8:
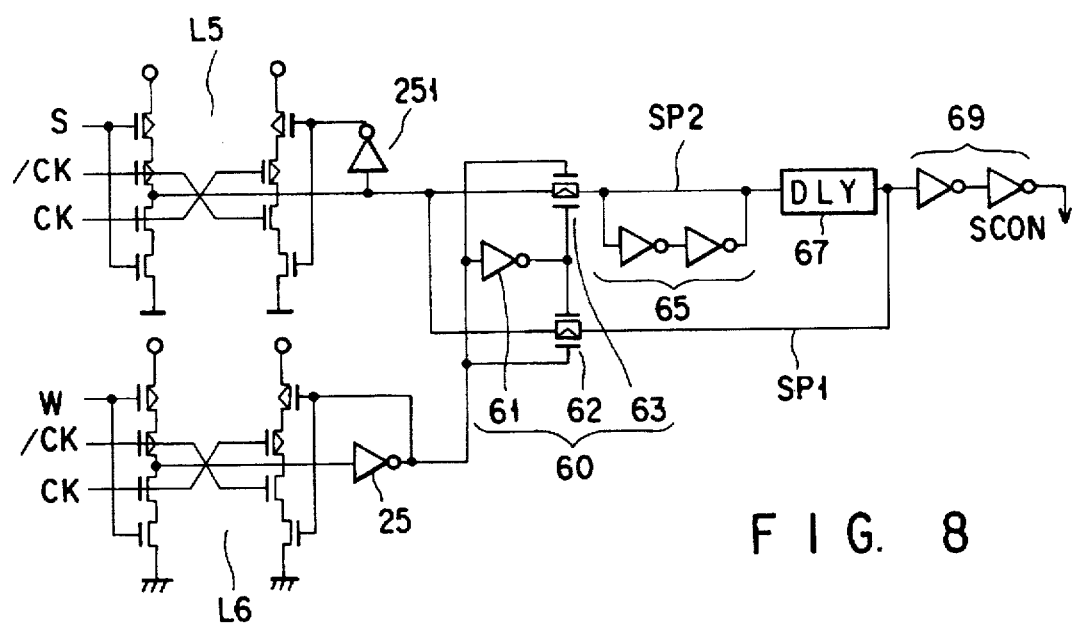
FIG. 8 is a circuit diagram of a signal-generating circuit designed to generate a signal SCON for controlling the pass gate shown in FIG. 6.

FIG. 8 is a circuit diagram illustrating a signal-generating circuit designed which generates the signal SCON for controlling the pass gate 3 shown in FIG. 6. As seen from FIG. 8, this circuit comprises latches L5 and L6. The latch L5 receives the signal S obtained by inverting the chip-selecting signal /S. The latch L6 receives the signal W obtained by inverting the write enable signal /W. Both latches L5 and L6 are identical in basic structure to, for example the latch L2 shown in FIG. 6. The latch L5 differs from the latch 6 in the connecting position of the inverter 251 and in the output logic. More precisely, the latch L5 output a signal which is inverse to the input signal S.

The signal-generating circuit further comprises a transfer control circuit 60, an inverter circuit 65, a delay circuit 67, and an inverter circuit 69. The transfer control circuit 60 has two signal paths SP1 and SP2. The signal path SP1 is activated when the output of the latch L6 falls to low level. The signal path SP2 is activated when the output of the latch L6 falls to high level. The inverter circuit 65 which is composed of two inverters connected in series functions to prevent floating of a potential at the signal path SP1. The inverter circuit 69 which is composed of two inverters connected in series operates as a drive buffer.

The operation of the circuit shown in FIG. 8 will be explained. When the operating mode of the SRAM is changed from the write mode to the read mode (that is, when the signal W falls to low level), the pass gates 62 and 63, both incorporated in the transfer control circuit 60, becomes conductive and non-conductive, respectively. At the same time, the signal S falls from high level H to low level L, whereby the signal SCON quickly rises to high level H. On the other hand, when the operating mode of the SRAM is changed from the read mode to the write mode, the pass gates 62 and 63 becomes non-conductive and conductive, respectively. At the same time, the signal S rises from low level L to high level H. In this case, the signal SCON falls to how level L upon lapse of the delay time of a delay circuit 67.

Thus, the signal SCON generated by the circuit shown in FIG. 8 causes the decoder 131 to decode a read address signal at high speed when the mode of the SRAM is changed from the write mode to the read mode, and causes the decoder 131 to decode a write address signal upon a lapse of a prescribed time when the mode of the SRAM is changed from the read mode to the write mode.

Figure 9:
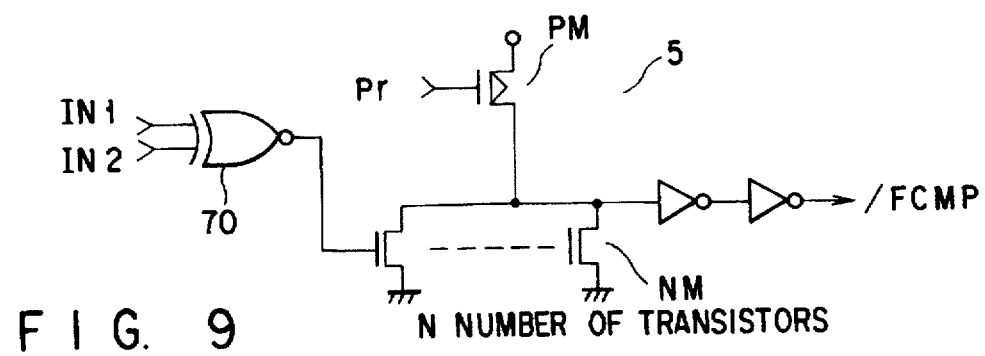
FIG. 9 is a circuit diagram of the comparator incorporated in the control circuit shown in FIG. 6.

FIG. 9 is a circuit diagram of the comparator 5 shown in FIG. 6. As illustrated in FIG. 9, the output of an EXOR gate 70 is connected to the gates of N-channel MOS transistors NM. The number of the MOS transistors NM is equal to the number of the bits forming the address signal. A P-channel MOS transistor PM is provided, whose source-drain path is connected between the power supply and an output node and whose gate is connected to receive a precharge signal Pr for activating the comparator 5.

The EXNOR gate 70 is one of two alternative types, which will be described in detail with reference to FIGS. 10 and 11.

Figure 10:
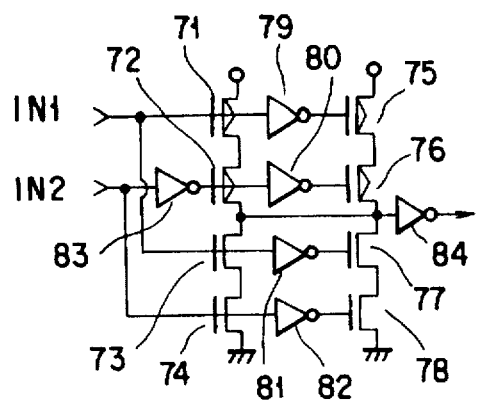
FIG. 10 is a circuit diagram of a first type of an EXNOR gate for use in the SRAM illustrated in FIG. 5.

The EXOR gate shown in FIG. 10 comprises two circuits which are connected between the power supply and the ground potential. The first circuit has P-channel MOS transistors 71 and 72 and N-channel MOS transistors 73 and 74 which are connected in series. Similarly, the second circuit has P-channel MOS transistors 75 and 76 and N-channel MOS transistors 77 and 78 which are connected in series. An inverter 79 is connected between the gates of the transistors 71 and 75. An inverter 80 is connected between the gates of the transistors 72 and 76. An inverter 81 is connected between the gates of the transistors 73 and 77. An inverter 82 is connected between the gates of the transistors 74 and 78. The first input terminal IN1 is connected to the gates of the transistors 71 and 73, and the second input terminal IN2 to the input of an inverter 83 and the gate of the transistor 72. The node of the transistors 72 and 73 and the node of the transistors 76 and 77 are connected to the input of an inverter 84. The output of the inverter 84 is the logic output of the EXOR gate.

Figure 11:
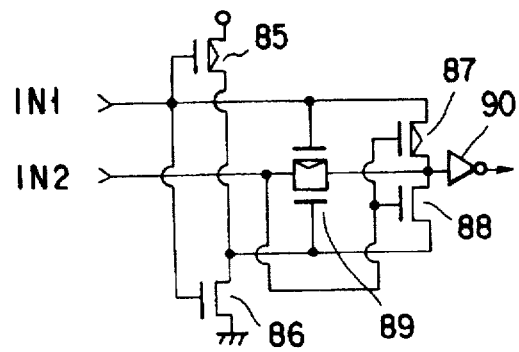
FIG. 11 is a circuit diagram of a second type of an EXNOR for use in the SRAM illustrated in FIG. 5.

The EXOR gate shown in FIG. 11 comprises a P-channel MOS transistor 85, an N-channel MOS transistor 86, two input terminals IN1 and IN2, a P-channel MOS transistor 87, an N-channel MOS transistor 88, and an inverter 90. The transistors 85 and 86 are connected in series between the power supply and the ground potential. The gates of these transistors 85 and 86 are connected to the first input terminal IN1. The transistors 87 and 88 are connected in series between the gate node and drain node of the transistors 85 and 86. The gate node of the transistor 87 and 88 is connected to the second input terminal IN2. The gate node and drain node of the transistors 87 and 88 are connected by a pass gate 89. The P-channel end of the pass gate 89 is controlled by the signal supplied to the first input terminal IN1. The N-channel end of the pass gate 89 is controlled by the signal output from the drain node of the transistors 85 and 86. The drain node of the transistors 87 and 88 is connected to the input of the inverter 90. The output of the inverter 90 is the logic output of the EXOR gate.

Figure 12:
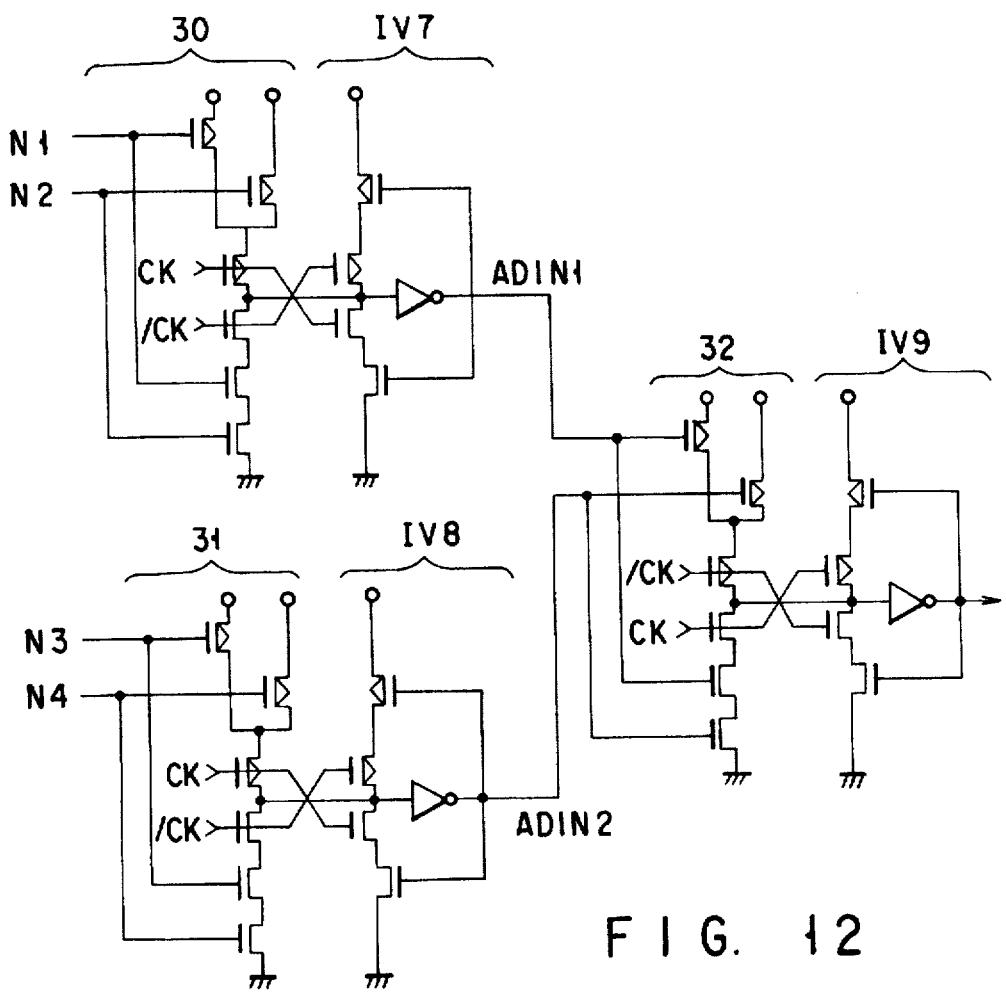
FIG. 12 is a circuit diagram of the address register incorporated in the control circuit shown in FIG. 6.

FIG. 12 is a circuit diagram of an example of the address register 101 shown in FIGS. 5 and 6. This example is designed on the assumption that the address signal to be input to the decoder 131 consists of four bits. The address register comprises three identical circuits which are similar to the signal-generating circuit illustrated in FIG. 7. These circuits cooperate to hold and output an address signal in response to the clock signal CK or /CK.

The first circuit comprises a clocked NAND gate 30 and a clocked inverter IV7, the second circuit a clocked NAND gate 31 and a clocked inverter IV8, and the third circuit a clocked NAND gate 32 and a clocked inverter IV9. The NAND gate 30 generates a logic output from the two inputs received at the input terminals N1 and N2. Similarly, the NAND gate 31 generates a logic output from the two inputs received at the input terminals N3 and N4. The inverter IN7 latches the output of the NAND gate 30 and converts it to an AND output ADIN1, and the inverter IN8 latches the output of the NAND gate 31 and converts it to an AND output ADIN2. The AND outputs ADIN1 and ADIN2 are supplied to the clocked AND gate 32, which generates a NAND output. The inverter IV9 latches the NAND output of the AND gate 32 and converts it to an AND output. The output of the clocked inverter IV9 is supplied to the late-write decoding control circuit 120 which is shown in FIG. 5.

How a word line is activated to access an address and how data is transferred to a bit line in the late-write type SRAM (FIG. 5) will be explained, with reference to a timing chart of FIG. 13.

In a read cycle preceding the cycle 3, the pass gates 3 and 10 are activated by the signals /SCON and /WRITE, respectively. One of the cells of the memory-cell array 108 is thereby selected in accordance with the address signal held in the register 101.

The cycle 3 is a storage cycle which replaces the dummy cycle shown in FIG. 4 and in which the write-address signal Astr is fetched. The write-address signal Astr designates the address for the last data Dstr to be written in the preceding write cycle. The signal Astr is held in the register 110, and the data Dstr is held in the register 104.

The cycle 4 is a write cycle, in which the address signal A3 is stored into the register 101. In the first half of the cycle 4, the data Dstr is written in accordance with the write-address signal Astr. At this time, the pass gate 3 is activated by the signal SCON and designates an address in accordance with the address signal stored in the register 110. In the latter half of the cycle 4, the pass gate 3 and the pass gate 10 are activated by the signal /SCON and the signal WRITE, thereby selecting that memory cell of the array 108 which corresponds to the address signal A3 stored in the register 101.

Then, in the cycle 5, the address signal A4 is stored into the register 101. The memory cell corresponding to the address signal A3 is already selected at the start of the cycle 5. Hence, in the first half of the cycle 5, the data D3 is written into the memory cell selected, and the address signal A4 and the data D4 are stored into the registers 110 and 104, respectively. In the latter half of the cycle 5, one memory cell is selected in accordance with the address signal A4.

The D4 should be written in the cycle 5 into the cell corresponding to the address signal A4 if the SRAM remained in the write mode. Since the cycle 5 is a read cycle, however, the data D4 is not written. The address signal A4 and the data D4 are held in the registers 110 and 104 until the next write cycle. In the first half of the next write cycle, the data D4 is written into the memory cell which corresponds to the address signal A4.

To read the data Dstr for the last write cycle in the cycle 6, the data Dstr is first read from the storage node of the register 104. Namely, the last write-address signal. Astr is held in the storage node of the register 110. The comparator 5 determines whether or not the address signal Astr is identical to the address signal externally input (i.e., the output of the register 101). If the signal Astr is identical to the externally input address signal, the pass gate 6 is activated by the signal FCMP, whereby the data Dstr is transferred to the register 105. The data Dstr is read as the I/O data DQ from the output buffer 109 which is controlled by the signal /G.

Figure 13:
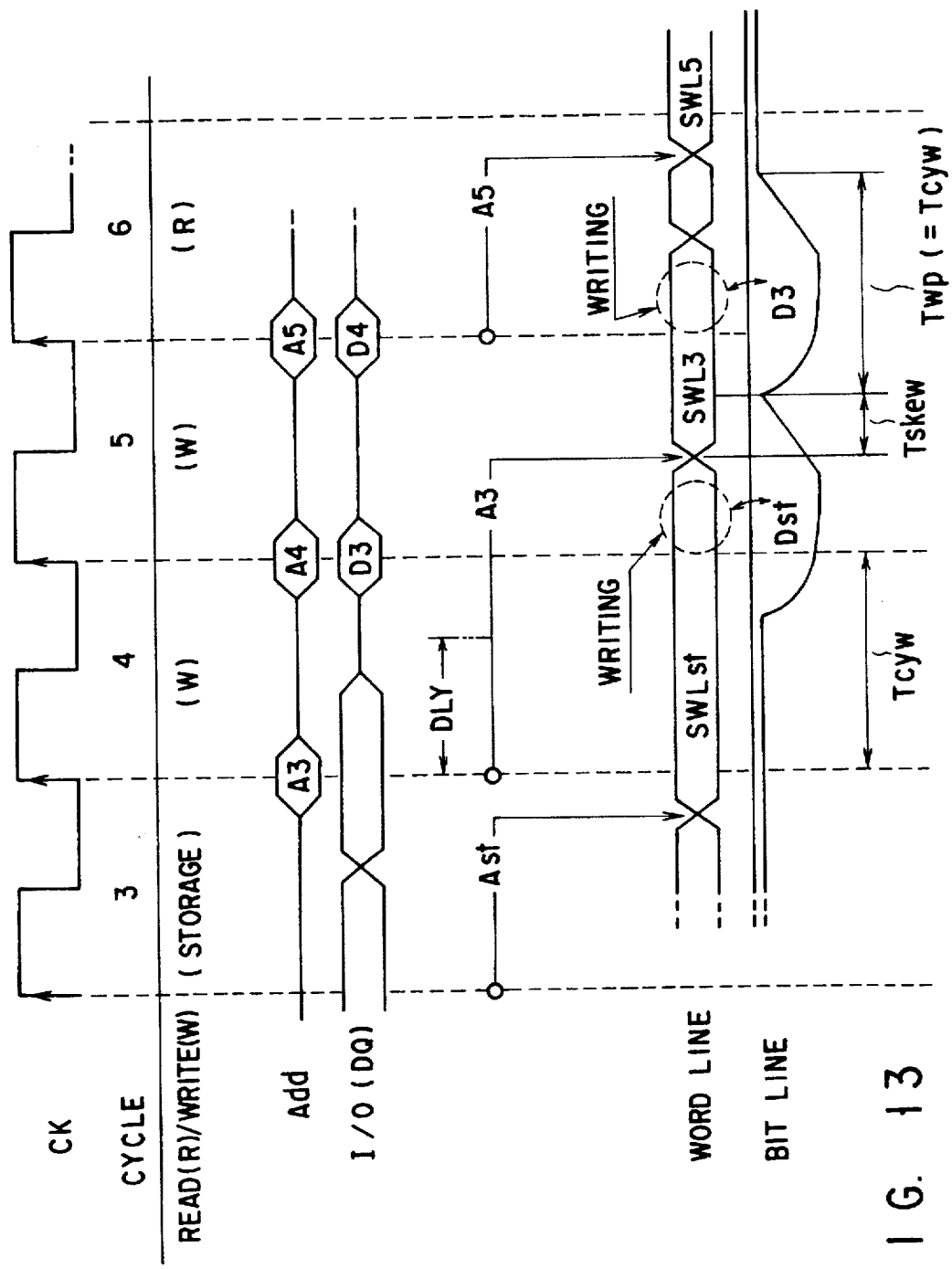
FIG. 13 is a timing chart explaining how a word line is activated to access an address and how data is transferred to a bit line, in one mode.

As may be clear when FIG. 13 is compared with FIG. 4, the late-write type SRAM is characterized in that the write-timing margin Tskew is compensated for, and Tcyw=Twp. Thus, the cycle time is shortened by Tskew.

The SRAM according to the invention has a write-timing margin Tskew as in the case shown in FIG. 4. However, the address signal A3 is decoded to write the data D3, earlier by Tskew than in the case shown in FIG. 4. In other words, the cycle overlaps the preceding cycle by the write-timing margin Tskew. To more specific, that part of the cycle which overlaps the preceding cycle is the period of recovering the bit-line potential after the data-writing in the preceding cycle. Since a word line is selected in accordance with an address signal upon lapse of the delay time DLY (FIG. 13), the data is completely written in the preceding cycle. The delay time DLY is the sum of the delay periods of the delay circuits 4-1 and 4-2, both shown in FIG. 5.

The data can be written well before a word line is selected in the next read cycle. For example, the data D3 can be completely written well before the word line SWL5 is selected for the read cycle 6. That is, when the selecting of the word line is started, the potential of the bit line has already been recovered. Thus, a margin has been compensated for, and the time for accessing data to read it immediately after it has been written can be prevented from increasing.

In any read cycle, the read-address signal is supplied neither through the delay circuit 4-1 nor through the delay circuit 4-2. Hence, the word line SWL5 can be selected within the shortest delay time required for decoding an address signal. A word line SWL4 corresponding the write-address signal A4 is not used in the cycle 6. The data which should be written in the last write cycle, i.e., In the cycle 5, the data D4 corresponding the write-address signal A4, is not written in the cycle 6, either. Rather, the signal A4 and the data D4 are held in the registers 110 and 104, respectively. They are accessed at the beginning of the next write cycle.

In the present invention, an address signal is decoded at one speed to write data and at another speed to read the data. The time by which the decoding of the address A5 is delayed in a read cycle is minimized. This helps to reduce the time required for accessing the data. As the case of data accessing illustrated in FIG. 13, for example, the minimum write-cycle time Tcyw is equal to the width of the writing pulse. More correctly, the time Tcyw is 2.4 ns, 0.6 ns shorter than in the case shown in FIG. 4. That is, the time Tcyw is is reduced about 20%.

Despite the reduction of the cycle time, a sufficient time is provided for writing data, and the bit line can have its potential fully recovered. The data-reading is therefore not delayed When the operating mode is switched from the write mode to the read mode. In view of this, the SRAM according to the present invention is advantageous in proportion to its storage capacity and its operating speed.

In the embodiment described above, the SRAM is performed data-accessing in synchronism with the leading edge of the clock signal CK. Nonetheless, the SRAM can be performed data-accessing in synchronism with the leading edge of the clock signal CK, but also at the trailing edge thereof as illustrated in FIG. 13. If this is the case, the transfer rate of internal data will be twice as high.

As shown in FIG. 13, the cycle 3 is a storage cycle. Instead, it may be a dummy cycle. In other words, the word line can be selected in the cycle 4 in accordance with the write-address signal Astr. For example, in the cycle 3, the write-address signal can be transferred at the same speed as an address is in an ordinary write cycle (4), unless this impairs the data-accessing operation.

As has been described, the present invention is based on the fact that the cycle time is lengthened because of the write-timing margin (Tskew) in the late-write method. Since the delay of accessing a word line is minimized in the read mode and is maximized in the write mode, by utilizing the late-write method. Data can therefore be written at high speed. Moreover, the write-timing margin (Tskew) is compensated for, the overall read-write time can be reduced, and the bit line can fast recover its initial potential, successfully preventing a delay of the reading of data immediately after any write cycle. The present invention can therefore provided a synchronous SRAM which operates at high speed and with high reliability.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A static random-access memory of late-write type wherein a memory-cell array is accessed in synchronism with a clock signal, and data is read in a read cycle for designating a read-address signal and written in a write cycle next to a cycle for designating a write-address signal, said static random-access memory comprising:

word lines and bit lines for selecting memory cells provided in said memory-cell array, so as to write data or read data;

means for selecting, in the write cycle, one of said word lines which corresponds to the write-address signal, in a cycle for designating the write-address signal, and for writing the data into one of said memory cells by maintaining the word line in a selected state for an additional delay time until the data is designated in the next write cycle and appears in the bit lines; and means for selecting, in the read cycle, one of said word lines which corresponds to the read-address signal, in a cycle for designating the read-address signal, without spending the additional delay time.

2. A static random-access memory of late-write type, wherein a memory-cell array is accessed in synchronism with a clock signal, data is read in a read cycle for designating a read-address signal and written in a write cycle next to a cycle for designating a write-address signal, a timing of decoding said read-address signal in said read cycle is different from a timing of decoding said write-address signal in a cycle preceding the write cycle, thereby accessing said memory-cell array at a time in a read mode and at a different time in a write mode.

3. A static random-access memory of late-write type wherein a memory-cell array is accessed in synchronism with a clock signal, and data is read in a read cycle for designating a read-address signal and written in a write cycle next to a cycle for designating a write-address signal, said static random-access memory comprising:

a first decoding path through which the memory-cell array is accessed in accordance with the read-address signal; and a second decoding path through which the memory-cell array is accessed in accordance with the write-address signal.

4. A static random-access memory of late-write type wherein a memory-cell array is accessed in synchronism with a clock signal, and data is read in a read cycle for designating a read-address signal and written in a write cycle next to a cycle for designating a write-address signal, said static random-access memory comprising:

a first decoding path through which the memory-cell array is accessed in accordance with the read-address signal;

a second decoding path through which the memory-cell array is accessed in accordance with the write-address signal;

a delay circuit connected to said second decoding path; and a third decoding path through which the memory-cell array is accessed in accordance with the write-address signal in a cycle preceding the first write cycle which comes after the operating mode is switched from a read mode to a write mode.

5. The static random-access memory according to claim 4, wherein said third decoding path transfers data at the same speed as said first decoding path.

6. The static random-access memory according to claim 4, wherein said third decoding path transfers data at the same speed as said second decoding path.

7. The static random-access memory according to claim 4, wherein said third decoding path includes an address register for holding the write-address signal designated in said write cycle, and said memory-cell array is accessed in accordance with the write-address signal from the address register, when said third decoding path is selected.

8. The static random-access memory according to claim 4, wherein one of said first, second and third decoding path is selected in accordance with a signal generated by synthesizing a chip-selecting signal and a write enable signal both supplied externally.

9. The static random-access memory according to claim 4, wherein one of said first, second and third decoding path is selected in accordance with a signal generated by synthesizing a data output control signal and a write enable signal both supplied externally.

10. The static random-access memory according to claim 4, which further comprises:

a data register for holding data corresponding to said write-address signal;

a comparator for comparing the read-address signal in said first decoding path with the write-address signal in said third decoding path; and a switching circuit having a first data path for transferring data from said memory-cell array and a second data path for transferring data from said data register, wherein one of said data paths is selected in accordance with an output signal of said comparator, and the data read from said data register is used as output data when said comparator determines that the read-address signal is identical to the write-address signal.

11. The static random-access memory according to any one of claims 1 to 4, wherein said memory-cell array is accessed at the leading edge of said clock signal.

12. The static random-access memory according to any one of claims 1 to 4, wherein said memory-cell array is accessed at the leading edge and trailing edge of said clock signal.

13. A static random-access memory of late-write type wherein a memory-cell array is accessed in synchronism with a clock signal, and data is read in a read cycle for designating a read-address signal and written in a write cycle next to a cycle for designating a write-address signal, said static random-access memory comprising:

a first register for receiving and holding address signals including a write-address signal, in synchronism with the clock signal;

a second register for receiving and holding the write-address signal from said first register and hold the write-address signal, in synchronism with the clock signal;

a first switching circuit having first and second paths and designed to select one of the first and second paths, said first path provided for transferring an address signal from said first register and said second path provided for transferring a write-address signal from said second register;

a second switching circuit provided between said first register and said first path, having third and fourth paths and designed to select one of the third and fourth paths, said third path connected directly to said first path and said fourth path connected by a delay circuit to said first path; and control means for controlling said first and second switching circuits such that said memory-cell array is accessed in the read cycle in accordance with the read-address signal supplied through said third and first paths in the order and accessed in the write cycle in accordance with the write-address signal supplied through said fourth and first path in the order and accessed in accordance with the write-address signal supplied through said second path in a cycle between said read and write cycles, which immediately precedes the first write cycle which comes after the operating mode is switched from a read mode to a write mode.

14. The static random-access memory according to claim 13, wherein said control means controls said first and second switching circuits in accordance with a signal generated by synthesizing a chip-selecting signal and a write enable signal both supplied externally.

15. The static random-access memory according to claim 13, wherein said control means controls said first and second switching circuits in accordance with a signal generated by synthesizing a data output control signal and a write enable signal both supplied externally.

16. The static random-access memory according to claim 13, which further comprises:

a third register for holding data corresponding to said write-address signal;

a comparator for comparing an output signal of said first register with an output of said second register;

a fifth path for transferring data from said memory-cell array;

a sixth path for transferring data from said third register; and a third switching circuit for selecting one of said fifth and sixth paths in accordance with an output signal of said comparator, wherein the data read from said third register is used as output data when when said comparator determines that the read-address signal is identical to the write-address signal.

17. The static random-access memory according to claim 13, wherein said memory-cell array is accessed at the leading edge of said clock signal.

18. The static random-access memory according to claim 13, wherein said memory-cell array is accessed at the leading edge and trailing edge of said clock signal.

* * * * *